(12) United States Patent
Kageyama

(10) Patent No.: US 9,676,978 B2
(45) Date of Patent: Jun. 13, 2017

(54) RESIN COMPOSITION FOR SEALING

(71) Applicant: AJINOMOTO CO., INC., Tokyo (JP)

(72) Inventor: Yuichi Kageyama, Kawasaki (JP)

(73) Assignee: AJINOMOTO CO., LTD., Tokyo (JP)

( * ) Notice: Subject to any disclaimer, the term of this patent is extended or adjusted under 35 U.S.C. 154(b) by 47 days.

(21) Appl. No.: 14/331,421

(22) Filed: Jul. 15, 2014

(65) Prior Publication Data

US 2014/0323669 A1 Oct. 30, 2014

Related U.S. Application Data

(63) Continuation of application No. PCT/JP2013/050509, filed on Jan. 15, 2013.

(30) Foreign Application Priority Data

Jan. 16, 2012 (JP) .................. 2012-006463

(51) Int. Cl.
| | |
|---|---|
| *C08F 210/10* | (2006.01) |
| *C09K 3/10* | (2006.01) |
| *C08L 23/22* | (2006.01) |
| *H01L 51/56* | (2006.01) |
| *C08L 53/00* | (2006.01) |
| *C08L 63/00* | (2006.01) |
| *H01L 51/52* | (2006.01) |

(52) U.S. Cl.
CPC ............ *C09K 3/1006* (2013.01); *C08L 23/22* (2013.01); *C08L 53/005* (2013.01); *C08L 63/00* (2013.01); *H01L 51/524* (2013.01); *H01L 51/56* (2013.01); *C09K 2200/0617* (2013.01); *C09K 2200/0632* (2013.01); *H01L 51/5253* (2013.01)

(58) Field of Classification Search
CPC .... C08F 8/08; C08F 8/46; C08F 10/10; C08F 210/10; C08L 53/005
See application file for complete search history.

(56) References Cited

U.S. PATENT DOCUMENTS

| | | | |
|---|---|---|---|
| 8,809,442 B2 | 8/2014 | Kageyama | |
| 2008/0249236 A1 | 10/2008 | Nakashima et al. | |
| 2008/0286571 A1 | 11/2008 | Ichimura et al. | |
| 2009/0026934 A1 | 1/2009 | Fujita et al. | |
| 2011/0121356 A1* | 5/2011 | Krawinkel | ............ C03C 27/10 257/100 |
| 2012/0283375 A1 | 11/2012 | Kageyama | |
| 2014/0141271 A1 | 5/2014 | Uemura et al. | |

FOREIGN PATENT DOCUMENTS

| | | |
|---|---|---|
| EP | 1 674 432 A1 | 6/2006 |
| EP | 2 752 453 A1 | 7/2014 |
| JP | 6-25511 A | 2/1994 |
| JP | 6-37212 A | 2/1994 |
| JP | 2000-96019 A | 4/2000 |
| JP | 2005-154528 A | 6/2005 |
| JP | 2008-69302 A | 3/2008 |
| JP | 2008248055 A * | 10/2008 |
| JP | 2012-193335 A | 10/2012 |
| TW | 223643 B | 5/1994 |
| WO | WO 92/11295 A1 | 7/1992 |
| WO | WO 2005/033035 A1 | 4/2005 |
| WO | WO 2011/062167 A1 | 5/2011 |
| WO | WO 2013/002288 A1 | 1/2013 |
| WO | WO 2013/030944 A1 | 3/2013 |
| WO | WO 2013/031656 A1 | 3/2013 |
| WO | WO 2013/096068 A1 | 6/2013 |

OTHER PUBLICATIONS

Extended European Search Report issued Aug. 11, 2015 in Patent Application No. 13738790.8.
International Search Report issued Apr. 23, 2013 in PCT/JP2013/050509.

* cited by examiner

*Primary Examiner* — Mark Kaucher
(74) *Attorney, Agent, or Firm* — Oblon, McClelland, Maier & Neustadt, L.L.P.

(57) ABSTRACT

A sealing resin composition simultaneously having good transparency, resistance to moisture permeability, and adhesiveness resistant to heat and humidity, and a sealing resin composition sheet obtained therefrom. Using a resin composition containing (A) a styrene-isobutylene modified resin and (B) a tackifier resin as a sealing resin composition, a resin composition layer composed of the resin composition may be formed on a support to give a sealing resin composition sheet.

18 Claims, No Drawings

RESIN COMPOSITION FOR SEALING

CROSS REFERENCES TO RELATED APPLICATIONS

This application is a continuation of International Patent Application No. PCT/JP2013/050509, filed on Jan. 15, 2013, and claims priority to Japanese Patent Application No. 2012-006463, filed on Jan. 16, 2012, both of which are incorporated herein by reference in their entireties.

BACKGROUND OF THE INVENTION

Field of the Invention

The present invention relates to a sealing resin composition, and particularly relates to a sealing resin composition that can be preferably used for sealing an organic EL element and the like.

Discussion of the Background

Organic EL (Electroluminescence) element is a material attracting attention in recent years, which is a luminescence element using an organic substance as a luminescence material and capable of providing high-intensity luminescence at a low voltage. However, since organic EL element is extremely weak to the moisture, the organic material itself is altered by the moisture, problems occur in that the brightness decreases, luminescence is not produced, the interface between the electrode and the organic EL layer is detached due to an influence of moisture, and the metal is oxidized to be highly resistant.

When a thermoset resin composition is used as an entire surface-sealing material, advantages are that the lamination operation is easy since the material viscosity before curing is low, and the resistance to moisture permeability of the cured product after heat curing is high. On the other hand, however, a problem occurs in that the organic EL element is degraded due to the heating temperature during heat curing. In addition, since the light is blocked by a getter agent layer incorporated for the purpose of dehydration in a sealing space in conventional can sealing structures, the efficiency of light emission from the sealing face is defectively poor. However, an advantage of highly efficient emission of luminescence from the sealing face side can be afforded by a structure wherein the entire surface is sealed with a resin composition. In this case, the sealing material is required to be transparent to afford high emission efficiency.

As a method for avoiding heat deterioration of an organic EL element, patent document 1 discloses a resin composition containing a polyisobutylene resin, a polyisoprene resin and/or a polyisobutylene resin having a functional group capable of reaction with an epoxy group, a tackifier resin, and an epoxy resin. However, transparency is not referred to, and sufficient study has not been conducted.

DOCUMENT LIST

Patent Document patent document 1: WO2011-62167

SUMMARY OF THE INVENTION

Problems to be Solved by the Invention

The problem to be solved by the present invention is to provide a sealing resin composition having good transparency, resistance to moisture permeability, and adhesiveness resistant to heat and humidity, and a sealing resin composition sheet obtained therefrom.

Means of Solving the Problems

The present inventors have conducted intensive studies, and found that the above-mentioned problem can be solved by using a resin composition containing (A) a styrene-isobutylene modified resin and (B) a tackifier resin, which resulted in the completion of the present invention.

Accordingly, the present invention includes the following embodiments.

[1] A sealing resin composition comprising (A) a styrene-isobutylene modified resin and (B) a tackifier resin.
[2] The sealing resin composition of the above-mentioned [1], wherein (A) the styrene-isobutylene modified resin is a styrene-isobutylene-styrene modified resin.
[3] The sealing resin composition of the above-mentioned [1], wherein (A) the styrene-isobutylene modified resin is a block copolymer containing a polystyrene skeleton and a polyisobutylene skeleton, and having a functional group.
[4] The sealing resin composition of the above-mentioned [3], wherein the functional group is one or more kinds selected from the group consisting of an acid anhydride group, an epoxy group, a carboxyl group, an amino group, a hydroxyl group, an isocyanate group, an oxazoline group, an oxetane group, a cyanate group, a phenol group, a hydrazide group, and an amide group.
[5] The sealing resin composition of any of the above-mentioned [1]-[4], wherein the content of (A) the styrene-isobutylene modified resin is 35-80 mass % when the non-volatile component in the resin composition is 100 mass %.
[6] The sealing resin composition of any of the above-mentioned [1]-[5], wherein (B) the tackifier resin is an alicyclic petroleum resin.
[7] The sealing resin composition of any of the above-mentioned [1]-[5], wherein (B) the tackifier resin is an alicyclic saturated hydrocarbon resin and/or an alicyclic unsaturated hydrocarbon resin.
[8] The sealing resin composition of any of the above-mentioned [1]-[5], wherein (B) the tackifier resin is a cyclohexane ring-containing saturated hydrocarbon resin and/or a dicyclopentadiene-modified hydrocarbon resin.
[9] The sealing resin composition of any of the above-mentioned [1]-[8], wherein the content of (B) the tackifier resin is 5-60 mass % when the non-volatile component in the resin composition is 100 mass %.
[10] The sealing resin composition of any of the above-mentioned [1]-[9], further comprising (C) an epoxy resin.
[11] The sealing resin composition of any of the above-mentioned [1]-[10], further comprising (D) a curing agent.
[12] The sealing resin composition of any of the above-mentioned [1]-[11], wherein a cured product of the resin composition has a parallel light transmittance at 450 nm of 80-100%.
[13] The sealing resin composition of any of the above-mentioned [1]-[11], wherein the cured product of the resin composition has a moisture-vapor transmission of 1-40 g/m$^2$, and an adhesion strength after environment test of 10-50N/25 mm.
[14] A sealing resin composition sheet comprising the sealing resin composition of any of the above-mentioned [1]-[13] (that is, a sealing resin composition sheet having a resin composition layer of the sealing resin composition of any of the above-mentioned [1]-[13] formed on a support).

[15] The sealing resin composition sheet of the above-mentioned [14], which is for sealing an organic EL element.
[16] An organic EL device comprising the sealing resin composition of any of the above-mentioned [1]-[13] (that is, an organic EL device comprising an organic EL element sealed with the sealing resin composition of any of the above-mentioned [1]-[13]).

Effect of the Invention

According to the present invention, a sealing resin composition having good transparency, resistance to moisture permeability, and adhesiveness resistant to heat and humidity can be provided.

DETAILED DESCRIPTION OF THE PREFERRED EMBODIMENTS

The sealing resin composition of the present invention (hereinafter to be also abbreviated as "the resin composition of the present invention") characteristically comprises (A) a styrene-isobutylene modified resin and (B) a tackifier resin.
<(A) Styrene-Isobutylene Modified Resin>
The (A) styrene-isobutylene modified resin used in the present invention (hereinafter to be also abbreviated as "component (A)") is a copolymer containing a styrene skeleton and an isobutylene skeleton, and is not particularly limited as long as it has a functional group. The form of the copolymer is not particularly limited, and may be a random copolymer, a block copolymer, a graft copolymer or the like. The component (A) is preferably in a solid form at room temperature (25° C.).

Preferable embodiment of the component (A) is a block copolymer containing a polystyrene block (polystyrene skeleton) and a polyisobutylene block (polyisobutylene skeleton), and having a functional group, namely, a modified block copolymer which is a block copolymer wherein at least one of the polymer blocks of a polystyrene block (polystyrene skeleton) and a polyisobutylene block (polyisobutylene skeleton) has a functional group.

While the form of the block copolymer of such modified block copolymer is not particularly limited, it includes a diblock copolymer composed of a polystyrene block (polystyrene skeleton)-polyisobutylene block (polyisobutylene skeleton), a triblock copolymer composed of a polystyrene block (polystyrene skeleton)-polyisobutylene block (polyisobutylene skeleton)-polystyrene block (polystyrene skeleton), and the like. Preferred is a triblock copolymer (styrene-isobutylene-styrene block copolymer) composed of a polystyrene block (polystyrene skeleton)-polyisobutylene block (polyisobutylene skeleton)-polystyrene block (polystyrene skeleton). That is, the (A) styrene-isobutylene modified resin is preferably a modified styrene-isobutylene-styrene block copolymer (styrene-isobutylene-styrene modified resin).

The polyisobutylene skeleton may be an isobutylene homopolymer, or a copolymer of isobutylene with an appropriate amount of an olefin compound such as 1-butene, 2-butene and the like. The polystyrene skeleton may be a styrene homopolymer or a copolymer of styrene with an appropriate amount of at least one kind selected from the group consisting of p-methylstyrene, α-methylstyrene and indene.

The proportion of the polyisobutylene skeleton is preferably not less than 40 mass %, more preferably not less than 50 mass %, further preferably not less than 60 mass %, when the whole component (A) (i.e., modified block copolymer) is 100 mass %, since a resin composition having sufficient adhesiveness and resistance to moisture permeability is obtained. Also, it is not more than 98 mass %, more preferably not more than 95 mass %, further preferably not more than 90 mass %.

While the functional group is not particularly limited, one or more kinds selected from the group consisting of acid anhydride group, epoxy group, carboxyl group, amino group, hydroxyl group, isocyanate group, oxazoline group, oxetane group, cyanate group, phenol group, hydrazide group and amide group is/are preferable, and acid anhydride group and epoxy group are more preferable to improve the adhesion strength of the resin composition. Any one kind or two or more kinds of these functional groups may be used. The concentration of the functional group in the styrene-isobutylene modified resin is preferably 0.05-10 mmol/g.

When a styrene-isobutylene modified resin having an acid anhydride group is used, the resin preferably has an acid anhydride group concentration of 0.05-10 mmol/g, more preferably 0.2-5 mmol/g. The acid anhydride group concentration here is obtained according to the description of JIS K 2501 and from the acid number value which is defined as the number in mg of potassium hydroxide necessary for neutralizing the acid present in 1 g of the resin.

When a styrene-isobutylene modified resin having an epoxy group is used, the resin preferably has an epoxy group concentration of 0.05-10 mmol/g, more preferably 0.2-5 mmol/g. The epoxy group concentration here is obtained from the epoxy equivalents obtained based on JIS K 2501.

The (A) styrene-isobutylene modified resin can be obtained by, for example, graft modification of a styrene-isobutylene resin (e.g., block copolymer composed of a polystyrene block (polystyrene skeleton) and a polyisobutylene block (polyisobutylene skeleton)) with an unsaturated compound containing a functional group under radical reaction conditions.

While the number average molecular weight of component (A) is not particularly limited, it is preferably not more than 500000, more preferably not more than 300000, further preferably not more than 150000, to afford good coatability and good compatibility with other components of the resin composition. On the other hand, it is preferably not less than 10000, more preferably not less than 30000, further preferably not less than 60000, to prevent repellence during coating of the resin composition, express resistance of the resin composition sheet to moisture permeability and improve machine intensity. The number average molecular weight in the present invention is measured by gel permeation chromatography (GPC) method (based on polystyrene). Specifically, the number average molecular weight can be measured by the GPC method using LC-9A/RID-6A manufactured by SHIMADZU CORPORATION as a measuring apparatus, Shodex K-800P/K-804L/K-804L manufactured by Showa Denko K.K. as a column, and toluene and the like as a mobile phase at a column temperature of 40° C., and calculated using the analytical curve of standard polystyrene.

One or more kinds of component (A) can be used in combination. A preferable embodiment is, for example, use of a modified resin having an acid anhydride group and a modified resin having an epoxy group in combination.

Specific preferable examples of the component (A) include T-YP757B which is a modified block copolymer having an acid anhydride group (manufactured by SEIKO PMC CORPORATION), T-YP766 which is a modified block copolymer having an epoxy group (manufactured by SEIKO PMC CORPORATION) and the like.

While the content of component (A) in the resin composition of the present invention is not particularly limited, it is preferably not more than 80 mass %, more preferably not more than 75 mass %, further preferably not more than 70 mass %, when the non-volatile component in the resin composition is 100 mass %, to afford good coating performance and good compatibility and ensure good adhesiveness resistant to heat and humidity and handling property (tackiness suppression). To improve resistance to moisture permeability and also transparency, it is preferably not less than 35 mass %, more preferably not less than 40 mass %, further preferably not less than 45 mass %, when the non-volatile component in the resin composition is 100 mass %.

<(B) Tackifier Resin>

The (B) tackifier resin used in the present invention (hereinafter to be also abbreviated as "component (B)") is also called a tackifier, and is a resin that imparts adhesiveness when blended with a plastic polymer. While component (B) is not particularly limited, terpene resin, modified terpene resin (hydrogenated terpene resin, terpene phenol copolymer resin, aromatic modified terpene resin etc.), coumarone resin, indene resin, petroleum resin (aliphatic petroleum resin, hydrogenated alicyclic petroleum resin, aromatic petroleum resin, aliphatic-aromatic copolymer petroleum resin, alicyclic petroleum resin, dicyclopentadiene based petroleum resin and hydrides thereof etc.) are preferably used. Of these, terpene resin, aromatic modified terpene resin, terpene phenol copolymer resin, hydrogenated alicyclic petroleum resin, aromatic petroleum resin, aliphatic-aromatic copolymer petroleum resin, alicyclic petroleum resin are more preferable, alicyclic petroleum resin is more preferable, alicyclic saturated hydrocarbon resin and alicyclic unsaturated hydrocarbon resin are further preferable, and cyclohexyl ring (i.e., cyclohexane ring)-containing saturated hydrocarbon resin and dicyclopentadiene modified hydrocarbon resin are further more preferable, from the aspects of adhesiveness, resistance to moisture permeability, compatibility and the like of the resin composition. One or more kinds of component (B) may be used in combination.

The softening point of the component (B) is preferably 50-200° C., more preferably 90-180° C., further preferably 100-150° C., from the aspects of softening of the sheet in a lamination step of the resin composition sheet and desired heat resistance. The softening point is measured by the ring and ball method according to JIS K2207.

While the content of component (B) in the resin composition of the present invention is not particularly limited, it is preferably not more than 60 mass %, more preferably not more than 50 mass %, further preferably not more than 40 mass %, when the non-volatile component in the resin composition is 100 mass %, to maintain good resistance to moisture permeability. To afford sufficient adhesiveness, it is preferably not less than 5 mass %, more preferably not less than 10 mass %, further preferably not less than 15 mass %, when the non-volatile component in the resin composition is 100 mass %.

Examples of the commercially available product that can be used as component (B) include YS resin PX, YS resin PXN (both manufactured by YASUHARA CHEMICAL Co., Ltd.) and the like as the terpene resin; YS resin TO and TR series (both manufactured by YASUHARA CHEMICAL Co., Ltd.) and the like as the aromatic modified terpene resin; Clearon P, Clearon M, Clearon K series (all manufactured by YASUHARA CHEMICAL Co., Ltd.) and the like as the hydrogenation terpene resin; YS Polyster 2000, Polyster U, Polyster T, Polyster S, Mighty Ace G (all manufactured by YASUHARA CHEMICAL Co., Ltd.) and the like as the terpenephenol copolymer resin; Escorez 5300 series and 5600 series (both manufactured by Exxon Mobil Corporation) and the like as the hydrogenated alicyclic petroleum resin; ENDEX155 (manufactured by Eastman Chemical Company) and the like as the aromatic petroleum resin; QuintoneD100 (manufactured by Nippon Zeon Co., Ltd.) and the like as the aliphatic-aromatic copolymer based petroleum resin; Quintone1325, Quintone1345 (both manufactured by Nippon Zeon Co., Ltd.) and the like as the alicyclic petroleum resins; ARKON P100, ARKON P125, ARKON P140 (all manufactured by Arakawa Chemical Industries, Ltd.) and the like.

<(C) Epoxy Resin>

By further adding (C) an epoxy resin (hereinafter to be also abbreviated as "component (C)") to the resin composition of the present invention, other various properties can be stably maintained while suppressing the tackiness of the resin composition. The component (C) is not particularly limited, and may be any as long as it has tow or more epoxy groups on average per one molecule. Examples thereof include bisphenol A type epoxy resin, biphenyl type epoxy resin, biphenylaralkyl type epoxy resin, naphthol type epoxy resin, naphthalene type epoxy resin, bisphenol F type epoxy resin, phosphorus-containing epoxy resin, bisphenol S type epoxy resin, aromatic glycidyl amine type epoxy resin (e.g., tetraglycidyl diaminodiphenylmethane, triglycidyl-p-aminophenol, diglycidyl toluidine, diglycidyl aniline etc.), alicyclic epoxy resin, aliphatic chain epoxy resin, phenol novolac type epoxy resin, cresol novolac type epoxy resin, bisphenol A novolac type epoxy resin, epoxy resin having butadiene structure, bisphenol diglycidyl etherified product, naphthalenediol diglycidyl etherified product, phenols-glycidyl etherified product, and alcohols-diglycidyl etherified product, alkyl substituted product of these epoxy resins, halide and halogenide and the like. One or more kinds of component (C) may be used in combination.

As component (C), among these, bisphenol A type epoxy resin, bisphenol F type epoxy resin, phenol novolac type epoxy resin, biphenylaralkyl type epoxy resin, phenolaralkyl type epoxy resin, aromatic glycidyl amine type epoxy resin, epoxy resin having a dicyclopentadiene structure and the like are preferable to improve heat resistance and maintain superior resistance to moisture permeability of the resin composition of the present invention.

The component (C) may be in a liquid state or a solid state, or both liquid and solid may be used. Here, the "liquid state" and "solid state" are the states of the epoxy resin at room temperature (25° C.). The liquid epoxy resin and the solid state epoxy resin may be used at any ratio as long as the effect of suppressing the tackiness of the resin composition is maintained. Component (C) preferably has an epoxy equivalent within the range of 100-1500 g/eq, more preferably 150-1000 g/eq, further preferable 200-800 g/eq, to maintain good resistance to moisture permeability and suppress tackiness. The "epoxy equivalent" is the number of grams (g/eq) of the resin containing 1 gram equivalent of an epoxy group, which is measured according to the method defined in JIS K 7236.

While the content of component (C) in the resin composition is not particularly limited, it is preferably not more than 20 mass %, more preferably not more than 15 mass %, further preferably not more than 10 mass %, still more preferably not more than 10 mass %, further more preferably not more than 8 mass %, especially preferably not more than 6 mass %, when the non-volatile component in the resin composition is 100 mass %, to ensure good resistance to moisture permeability. To ensure good handling property (tackiness suppression), it is preferably not less than 0.1 mass %, more preferably not less than 1 mass %, further preferably not less than 2 mass %, further more preferably not less than 4 mass %, when the non-volatile component in the resin composition is 100 mass %.

Examples of the commercially available product that can be used as component (C) include "828EL" manufactured by JSR Corporation (liquid bisphenol A type epoxy resin), "HP4032" and "HP4032D" manufactured by DIC (naphthalene type bifunctional epoxy resin), "HP4700" manufactured by DIC (naphthalene type tetrafunctionalepoxy resin), "HP7200 series" manufactured by DIC CORPORATION (epoxy resin containing dicyclopentadiene skeleton), "ESN-475V" and "ESN-185V" manufactured by Tohto Kasei Co., Ltd. (naphthol type epoxy resin), "PB-3600" manufactured by Daicel Corporation (epoxy resin having butadiene structure), "NC3000H", "NC3000L", "NC3100", "NC3000" and "NC3000FH-75M" manufactured by Nippon Kayaku Co., Ltd. (biphenyl type epoxy resin), "YX4000" manufactured by JSR Corporation (biphenyl type epoxy resin), "YX8800" manufactured by JSR Corporation (epoxy resin containing anthracene skeleton) and the like. One or more kinds of these may be used in combination.

<(D) Curing Agent>

The present invention can further improve curability of the resin composition by containing (D) a curing agent (hereinafter to be also abbreviated as "component (D)"). While the component (D) is not particularly limited, amine-based curing agent, guanidine-based curing agent, imidazole-based curing agent, phosphonium-based curing agent, phenol-based curing agent and the like can be mentioned. One or more kinds of the component (D) may be used in combination.

While the amine-based curing agent is not particularly limited, quaternary ammonium salts such as tetramethylammonium bromide, tetrabutylammonium bromide and the like; diazabicyclo compounds such as DBU (1,8-diazabicyclo[5.4.0]undecene-7), DBN (1,5-diazabicyclo[4.3.0]nonene-5), DBU-phenoxide, DBU-octylate, DBU-p-toluenesulfonate, DBU-formate, DBU-phenolnovolac resin salt and the like; tertiary amines such as benzyldimethylamine, 2-(dimethylaminomethyl)phenol and the like and salts thereof, dimethylurea compounds such as aromatic dimethylurea, aliphaticdimethylurea, aromatic dimethylurea and the like; and the like can be mentioned. One or more kinds of these may be used in combination.

While the guanidine-based curing agent is not particularly limited, dicyandiamide, 1-methylguanidine, 1-ethylguanidine, 1-cyclohexylguanidine, 1-phenylguanidine, 1-(o-tolyl) guanidine, dimethylguanidine, diphenylguanidine, trimethylguanidine, tetramethylguanidine, pentamethylguanidine, 1,5,7-triazabicyclo[4.4.0]deca-5-ene, 7-methyl-1,5,7-triazabicyclo[4.4.0]deca-5-ene, 1-methylbiguanide, 1-ethylbiguanide, 1-n-butylbiguanide, 1-n-octadecylbiguanide, 1,1-dimethylbiguanide, 1,1-diethylbiguanide, 1-cyclohexylbiguanide, 1-allylbiguanide, 1-phenylbiguanide, 1-(o-tolyl)biguanide and the like can be mentioned. One or more kinds of these may be used in combination.

While the imidazole-based curing agent is not particularly limited, 1H-imidazole, 2-methyl-imidazole, 2-phenyl-4-methyl-imidazole, 1-cyanoethyl-2-ethyl-4-methyl-imidazole, 2-phenyl-4,5-bis(hydroxymethyl)-imidazole, 1-benzyl-2-methylimidazole, 1-benzyl-2-phenylimidazole, 2-ethyl-4-methyl-imidazole, 2-phenyl-imidazole, 2-dodecyl-imidazole, 2-heptadecylimidazole, 1,2-dimethyl-imidazole and the like can be mentioned. One or more kinds of these may be used in combination.

While the phosphonium-based curing agent is not particularly limited, triphenylphosphine, phosphoniumborate compound, tetraphenylphosphonium tetraphenylborate, n-butylphosphonium tetraphenylborate, tetrabutylphosphonium decanoate, (4-methylphenyl)triphenylphosphonium thiocyanate, tetraphenylphosphonium thiocyanate, butyltriphenylphosphonium thiocyanate and the like can be mentioned. One or more kinds of these may be used in combination.

While the kind of the phenol-based curing agent is not particularly limited, MEH-7700, MEH-7810 and MEH-7851 (manufactured by MEIWA PLASTIC INDUSTRIES, LTD.), NHN, CBN and GPH (manufactured by Nippon Kayaku Co., Ltd.), SN170, SN180, SN190, SN475, SN485, SN495, SN375 and SN395 (manufactured by Tohto Kasei Co., Ltd.), TD2090 (manufactured by DIC CORPORATION) and the like can be mentioned. Specific examples of the triazine skeleton-containing phenol-based curing agent include LA3018 (manufactured by DIC CORPORATION) and the like. Specific examples of the triazine skeleton-containing phenolnovolac curing agent include LA7052, LA7054 and LA1356 (manufactured by DIC CORPORATION) and the like. One or more kinds of these may be used in combination.

While the content of the component (D) in the resin composition is not particularly limited, it is preferably not more than 5 mass %, more preferably not more than 1 mass %, when the non-volatile component in the resin composition is 100 mass %, to prevent a decrease in the resistance to moisture permeability. To suppress tackiness, it is preferably not less than 0.01 mass %, more preferably not less than 0.05 mass %, when the non-volatile component in the resin composition is 100 mass %.

<Resin Additive>

The resin composition of the present invention may contain various resin additives other than the aforementioned components as long as the effect of the invention is not inhibited. Examples of such resin additive include inorganic fillers such as silica, alumina, barium sulfate, talc, clay, mica powder, aluminum hydroxide, magnesium hydroxide, calcium carbonate, magnesium carbonate, boron nitride, aluminum borate, barium titanate, strontium titanate, calcium titanate, titanium acid, bismuth titanate, magnesium titanate, barium zirconate, calcium zirconate and the like; hygroscopic metal oxide such as calcium oxide, magnesium oxide, strontium oxide, aluminum oxide, barium oxide, calcined dolomite (mixture containing calcium oxide and magnesium oxide), calcined hydrotalcite (multiple oxide with aluminum and the like and magnesium and the like) and the like; organic fillers such as rubber particles, silicon powder, nylon powder, fluorine powder and the like; thickeners such as Orben, Benton, and the like thickener; silicone-based, fluorine-based, polymer-based antifoaming agents or leveling agents; adhesion-imparting agents such as triazole compound, thiazole compound, triazine compound, porphyrin compound and the like; and the like.

The inorganic filler or hygroscopic metal oxide can have improved resistance to humidity by a surface treatment with a surface treating agent. Examples of the surface treating agent include aminosilane-based coupling agent, epoxysilane-based coupling agent, mercaptosilane-based coupling agent, vinylsilane-based coupling agent, imidazolesilane-based coupling agent, organosilazane compound, titanate-based coupling agent and the like. One or more kinds of these may be used in combination.

While the average particle size of the inorganic filler or hygroscopic metal oxide is not particularly limited, it is preferably not more than 5 μm, more preferably not more than 3 μm, to ensure transparency of the resin composition. To improve resistance to moisture permeability, it is preferably not less than 0.05 μm. The average particle size of the component (E) can be measured by the laser diffraction scattering method based on the Mie scattering theory. To be specific, it can be measured by forming the particle size distribution of the inorganic filler based on the volume standard by a laser diffraction particle size analyzer, and obtaining the average particle size of the median size thereof. A measurement sample obtained by dispersing an inorganic filler in water by ultrasonication can be preferably used. As the laser diffraction particle size analyzer, LA-500 manufactured by Horiba, Ltd. and the like can be used.

While the content of the inorganic filler or hygroscopic metal oxide is not particularly limited, it is preferably not more than 27 mass %, more preferably not more than 22 mass %, further preferably not more than 17 mass %, still more preferably not more than 12 mass %, especially preferably not more than 7 mass %, when the non-volatile component in the resin composition is 100 mass %, to ensure transparency of the resin composition. To improve resistance to moisture permeability, it is preferably not less than 0.05 μm. The average particle size of the component (E) can be measured by the laser diffraction scattering method based on the Mie scattering theory. While not less than 0 mass % is sufficient for the inorganic filler or hygroscopic metal oxide, the content is preferably not less than 0.5 mass %, more preferably not less than 1 mass %, when the non-volatile component in the resin composition is 100 mass %, to improve resistance to moisture permeability.

The method for preparation of the resin composition of the present invention is not particularly limited, and a method including mixing the blending components, after adding a solvent and the like where necessary, by a kneading roller, a rotary mixer, etc. and the like can be mentioned.

The transparency of the cured product of the resin composition of the present invention can be measured by a spectrophotometer. A higher transparency is preferable since it improves the luminescence efficiency of an EL element. Specifically, the parallel light transmittance at 450 nm is preferably not less than 80%, more preferably not less than 82%, further preferably not less than 84%, still more preferably not less than 86%, especially preferably not less than 88%, particularly preferably not less than 90%.

The adhesiveness resistant to heat and humidity of the cured product of the resin composition of the present invention can be measured by the Highly Accelerated life (pressure cooker) test. The adhesiveness resistant to heat and humidity can be judged by the adhesion strength after the environment test. That is, superior adhesion strength after the environment test means high water vapor barrier property, superior resistance to environmental degradation, and a long life of EL element luminescence. The adhesion strength after the environment test is preferably not less than 10N/25 mm, more preferably not less than 11N/25 mm, further preferably not less than 12N/25 mm, still more preferably not less than 13N/25 mm, especially preferably not less than 14N/25 mm, particularly preferably not less than 15N/25 mm. On the other hand, while a higher adhesion strength after the environment test is more preferable, it is practically preferably not more than 50N/25 mm, more preferably not more than 45N/25 mm.

The resistance to moisture permeability of the cured product of the resin composition of the present invention can be measured by the cup method of JIS Z 0208. Since a lower moisture-vapor transmission can delay invasion of the moisture into an EL element from the outside world, the measurement value of the resin composition layer having a thickness of 40 μm under the conditions of 60° C. 90% RH, 24 hr is preferably not more than 40 g/m$^2$, more preferably not more than 39 g/m$^2$, further preferably not more than 38 g/m$^2$, still more preferably not more than 37 g/m$^2$, especially preferably not more than 36 g/m$^2$, particularly preferably not more than 35 g/m$^2$. On the other hand, while a lower moisture-vapor transmission is better, it is practically preferably 1 g/m$^2$, more preferably not less than 5 g/m$^2$.

The resin composition of the present invention is preferably used for sealing of semiconductor, solar cell, high-brightness LED, LCD, EL element and the like, and particularly preferably used for sealing of organic EL element.

<Sealing Resin Composition Sheet>

In the sealing resin composition sheet of the present invention (hereinafter to be also abbreviated as "the resin composition sheet of the present invention"), a resin composition layer of the resin composition of the present invention is formed on a support. The resin composition layer can be formed by a method known to those of ordinary skill in the art, wherein, for example, the resin composition of the present invention is dissolved in an organic solvent to prepare varnish, the varnish is applied on a support and dried. The resin composition layer may be further heated to give a cured product. The organic solvent can be dried by hot air blowing and the like.

Examples of the organic solvent include ketones such as acetone, methylethyl ketone (hereinafter to be also abbreviated as "MEK"), cyclohexanone and the like; acetic acid esters such as ethyl acetate, butyl acetate, cellosolve acetate, propylene glycol monomethyletheracetate, Carbitol acetate and the like; Carbitols such as cellosolve, butyl carbitol and the like; aromatic hydrocarbons such as toluene, xylene and the like; dimethylformamide, dimethylacetamide, N-methylpyrrolidone and the like; aromatic mixed solvents such as solvent naphtha and the like. Examples of the aromatic mixed solvents include "Swasol" (manufactured by Maruzen Petrochemical Co., Ltd., trade name), and "Ipuzoru" (manufactured by Idemitsu Kosan Co., Ltd., trade name). One or more kinds of the organic solvents may be used in combination.

While the drying condition is not particularly limited, 50-100° C. for 1-60 min is preferable. When it is not less than 50° C., the amount of the solvent remaining in the resin composition layer can be easily decreased.

When the resin composition sheet of the present invention is used for sealing an element (e.g., organic EL element), the resin composition layer may be previously heat cured before the sealing step or heat cured after the sealing step. To reduce heat deterioration of the element (e.g., organic EL element), it is preferable to previously perform heat curing before the sealing step.

When the resin composition layer is heat cured before the sealing step, the curing condition is not particularly limited. However, the curing temperature is preferably 50-200° C., more preferably 100-180° C., further preferably 120-160° C. The curing time is preferably 15-120 min, more preferably 30-100 min.

When the resin composition layer is heat cured after the sealing step, the curing temperature is preferably 50-150° C., more preferably 60-100° C., further preferably 60-80° C. to prevent heat deterioration of the element (e.g., organic EL element).

The thickness of the resin composition layer in the resin composition sheet is preferably 3 μm-200 μm, more preferably 5 μm-100 μm, further preferably 5 μm-50 μm.

As mentioned later, when the object final sealing structure is a structure wherein a sealing substrate is laminated on the resin composition layer of the resin composition sheet, the part from which the moisture can enter is only the side part of the resin composition layer. Therefore, by reducing the layer thickness of the resin composition layer, the area of the side part where the outside air comes into contact becomes small. To block the moisture, therefore, it is desirable to reduce the layer thickness of the resin composition layer. However, when the layer thickness of the resin composition layer is too small, the element may be damaged when a sealing substrate is adhered, and the workability of adhering the sealing substrate tends to decrease. A thickness of the resin composition layer that falls within the above-mentioned preferable range is also effective for maintaining the uniformity of the thickness of the resin composition layer after transfer of the resin composition layer onto the sealing target (e.g., substrate on which an element is formed such as organic EL element and the like).

As a support to be used for the resin composition sheet, a support having moisture-proof property is preferable. Examples of the support having the moisture-proof property include plastic film having moisture-proof property, metal foil such as copper foil, aluminum foil, etc. and the like. Examples of the plastic film having the moisture-proof property include plastic films having an inorganic substance such as silicon oxide (silica), silicon nitride, SiCN, amorphous silicon and the like, which is vapor deposited on the surface and the like. Here, as the plastic film having an inorganic substance vapor deposited on the surface, plastic films of polyolefin (e.g., polyethylene, polypropylene, polyvinyl chloride etc.), polyester (e.g., poly(ethylene terephthalate) (hereinafter to be referred to as "PET"), poly(ethylene naphthalate) etc.), polycarbonate, polyimide and the like are preferable, and PET film is particularly preferable. Examples of the commercially available plastic film having moisture-proof property include TECHBARRIER HX, AX, LX and L series (manufactured by Mitsubishi Plastics, Inc.), X-BARRIER having further enhanced moisture-proof effect than TECHBARRIER HX, AX, LX and L series (manufactured by Mitsubishi Plastics, Inc.) and the like. As a support having the moisture-proof property, one having a multiple layer structure of 2 or more layers, for example, the above-mentioned plastic film and the above-mentioned metal foil adhered to each other via an adhesive can also be used. This is low in cost and advantageous from the aspects of handling property. As the support for a resin composition sheet, a support without moisture-proof property (e.g., single plastic film without an inorganic substance vapor deposited on the above-mentioned surface) can also be used.

While the thickness of the support is not particularly limited, it is preferably 10-150 μm, more preferably 20-100 μm, from the aspects of handling property of the resin composition sheet and the like.

The resin composition of the present invention sheet is preferably protected by a protective film before actual use for the formation of a sealing structure to prevent attachment of dirt and the like to the resin composition sheet surface and scar thereon. As the protective film, the plastic films recited for the support can be used. The protective film may be previously subjected to a mat treatment, a corona treatment as well as a release treatment. Specific examples of the mold lubricant include fluorine-based mold lubricant, silicone-based mold lubricant, alkyd resin-based mold lubricant and the like. Different kinds of mold lubricant may be used in a mixture. While the thickness of the protective film is not particularly limited, it is preferably 1-40 μm, more preferably 10-30 μm.

The resin composition of the present invention sheet is used be being laminated on a sealing target. The "laminate" here means the state where an object to be sealed is coated with a resin composition sheet provided with a support, or the state where an object to be sealed is coated with resin composition layer transferred from the resin composition sheet. When a resin composition sheet in which the support does not have moisture-proof property (e.g., single plastic film wherein the above-mentioned surface is not vapor deposited with an inorganic substance) is used, it is preferable to laminate a resin composition sheet on the object to be sealed, detach the support (i.e., resin composition layer is transferred), after which separately laminate a sealing substrate on the resin composition layer. Particularly, when the object to be sealed is a substrate on which an organic EL element is formed (hereinafter to be also referred to as "substrate for forming organic EL element"), an embodiment of lamination of such sealing substrate is preferable. The "sealing substrate" in the present invention is a support having moisture-proof property, which is used for the resin composition sheet and used singly without forming a resin composition layer. The "sealing substrate" also includes boards having high moisture-proof property but no flexible and unsuitable for use as a support of a resin composition sheet, such as glass plate, metal plate, steel plate and the like.

<Organic EL Device>

The organic EL device of the present invention includes an organic EL element sealed with the resin composition of the present invention.

For example, the organic EL device of the present invention is obtained by laminating the resin composition sheet of the present invention on an organic EL element forming substrate. When the resin composition sheet is protected with a protective film, it is detached, and a resin composition sheet is laminated on the substrate such that the resin composition layer directly contacts the substrate. The lamination method may be of a batch type or continuous type by a roll.

When the support of the resin composition sheet has moisture-proof property, a resin composition sheet is laminated on a substrate on which an organic EL element is formed, by which the sealing step of the organic EL element is completed without detaching the support. When heat curing is necessary after the sealing step, heat curing is performed.

In general, a sealing material for an organic EL element is requested to be free of absorbed moisture, by drying before a sealing operation and the operation is complicated. Since the resin composition of the present invention sheet using a support having moisture-proof property shows high resistance to moisture permeability, and shows low water absorption rate during preservation and during device production operation. In addition, the damage on the organic EL element during the sealing operation can be markedly reduced.

When a support without moisture-proof property is used as a resin composition sheet, the sealing step of an organic EL element is completed by laminating a resin composition sheet on an organic EL element forming substrate, detaching the support, and pressing sealing substrate to the exposed resin composition layer. Since the moisture-proof effect is enhanced, two or more sealing substrates may be adhered and used. Since the thickness of the sealing substrate makes the organic EL device itself thin and light, it is preferably not more than 5 mm, more preferably not more than 1 mm, further preferably not more than 100 μm. To prevent moisture permeation, it is preferably not less than 5 μm, more preferably not less than 10 μm, further preferably not less than 20 μm. The pressure during pressing the sealing substrate is preferably about 0.3-10 kgf/cm² and, for pressing under heating, 25° C.-130° C. is preferable.

When the organic EL element forming substrate is obtained by forming an organic EL element on a transparent substrate, and the transparent substrate side is the display side or a luminescent face of luminaire, the support of a resin composition sheet does not necessarily require use of a transparent material, and a metal plate, metal foil, nontransparent plastic film or board and the like may be used. Conversely, when the organic EL element forming substrate is obtained by forming an organic EL element on a substrate made from a nontransparent or low transparent material, a transparent plastic film, a glass plate, a transparent plastic plate and the like are used as the sealing substrate, since the sealing substrate side needs to be a display side or a luminescent face of luminaire.

The resin composition layer of the resin composition of the present invention sheet is heat cured, and the resin composition sheet is laminated on an organic EL element forming substrate to perform a sealing step, whereby an organic EL device can be produced without a heating step after the sealing step. As a result, the heat deterioration of the organic EL element can be drastically suppressed.

EXAMPLES

The present invention is explained in more detail in the following by referring to Examples, which are not to be construed as limitative. In the following description, unless particularly indicated, "part" means "parts by mass", and "%" means "mass %".

The materials used in the Examples and Comparative Examples are explained.
(A) Styrene-Isobutylene Modified Resin
  T-YP757B (manufactured by SEIKO PMC CORPORATION): maleic anhydride modified styrene-isobutylene-styrene block copolymer, maleic anhydride group concentration 0.464 mmol/g, number average molecular weight 100000
  T-YP766 (manufactured by SEIKO PMC CORPORATION): glycidyl methacrylate modified styrene-isobutylene-styrene block copolymer, glycidyl group (epoxy group) concentration 0.638 mmol/g, number average molecular weight 100000
(B) Tackifier Resin
  ARKON P125 (manufactured by Arakawa Chemical Industries, Ltd.: cyclohexyl ring-containing saturated hydrocarbon resin, softening point 125° C.
  quintone1345 (manufactured by Nippon Zeon Co., Ltd.: dicyclopentadiene modified hydrocarbon resin, softening point 140° C.
(C) Epoxy Resin
  HP7200H (manufactured by DIC CORPORATION): dicyclopentadiene type solid epoxy resin, epoxy equivalents 278 g/eq
(D) Curing Agent
  anion polymerization curing agent (2,4,6-tris(diaminomethyl)phenol, hereinafter abbreviated as TAP) (other materials)
  inorganic filler: talc ("D-600" manufactured by Nippon Talc Co., Ltd.)
  hygroscopic metal oxide: calcination hydrotalcite ("hydrotalcite" manufactured by Toda Kogyo Corp.)
  SIBSTAR-102T (manufactured by Kaneka Corporation): styrene-isobutylene-styrene block copolymer, number average molecular weight 100000, styrene content percentage 15%
  SIS5200 (manufactured by JSR); styrene-isoprene-styrene block copolymer, styrene content percentage 15%
  HV-300M (manufactured by JX Nippon Oil & Energy Corporation): maleic anhydride modified liquid polyisobutylene, modified product with number average molecular weight 1400, number of functional groups: 3.2/1 molecule, acid number: 43.4 mgKOH/g
  Swasol #1000 (manufactured by Maruzen Petrochemical Co., Ltd.: aromatic mixed solvent
  toluene

[Measurement Method, Evaluation Method]
Various measurement methods and evaluation methods are explained.

<Evaluation of Adhesiveness Resistant to Heat and Humidity>

A resin composition sheet using a PET film as a support (length 50 mm, width 20 mm) was laminated on aluminum foil (length 100 mm, width 20 mm, thickness 50 μm, manufactured by SUMIKEI ALUMINUM FOIL Co., Ltd., product No. SA50) by a batch type vacuum laminating machine (manufactured by Nichigo-Morton Co., Ltd, Morton-724). The lamination was performed under the conditions of temperature 80° C., time 20 seconds, pressure 1 kgf/cm² (9.8×10⁴ Pa). The PET film was detached, and a glass plate (length 76 mm, width 26 mm, thickness 1.2 mm, microslide glass) was further laminated on the exposed resin composition layer under the same conditions as the above. The adhesion strength of the obtained laminate was measured in the 90° direction relative to the length direction of the aluminum foil when detached at a tension rate of 50 mm/min (initial adhesion strength). Two samples were used and the average thereof was measured. A test piece produced in the same manner as above was maintained under the conditions of 121° C., 100% RH for 24 hr, and the adhesion strength was measured by the above-mentioned method (adhesion strength after environment test). An adhesion strength after environment test of not less than 0N/25 mm and less than 10N/25 mm was marked with "failure (×)", not less than 10N/25 mm and less than 20N/25 mm was marked with "good (○)", and not less than 20N/25 mm and less than 30N/25 mm was marked with "excellence (◉)". A sample that showed delamination of the aluminum foil due to expansion after the environment test was marked with "–".

<Measurement and Evaluation of Resistance to Moisture Permeability>

Measured according to JIS Z0204 and using a resin composition sheet (thickness 40 μm) and a cup method. The measurement conditions were temperature 60° C., relative humidity 90%, 24 hr. A moisture-vapor transmission of not less than 10 g/m² and less than 25 g/m² was marked with "excellence (◉)", not less than 25 g/m² and less than 40 g/m² was marked with "good (○)", and not less than 40 g/m² was marked with "failure (×)".

<Measurement and Evaluation of Transparency>

Using a resin composition sheet (thickness 40 μm) and by spectrophotometer UV-mini1000 manufactured by SHIMADZU CORPORATION, the optical spectrum from 300 nm to 1000 nm was measured. The parallel light transmittance at 450 nm was taken as the transparency. The transparency of not less than 70% and less than 80% was marked with "failure (×)", not less than 80% and less than 90% was marked with "good (○)", and not less than 90% was marked with "excellence (◎)".

Example 1

A resin composition sheet was obtained by the method described below. Unless otherwise specified, the number of parts of the parts by mass (hereinafter to be abbreviated as "parts") of each component is the value based on the solid content.

A maleic anhydride modified styrene-isobutylene-styrene block copolymer (T-YP757B, 40% Swasol solution, 45 parts) was mixed with a dicyclopentadiene modified hydrocarbon resin (quintone1345, 60% toluene solution, 14 parts) and a cyclohexyl ring-containing saturated hydrocarbon resin (ARKON P125, 60% toluene solution, 40 parts), and the mixture was mixed in a high-speed rotation mixer to give a uniform mixed solution. The mixed solution was uniformly mixed with a glycidyl modified styrene-isobutylene-styrene block copolymer (T-YP766, 40% Swasol solution, 55 parts) and an anion polymerization curing agent (TAP, 1 part) in a high-speed rotation mixer to give varnish. The obtained varnish was uniformly applied onto a release-treated surface (treated with an alkyd-based mold lubricant) of a PET film (thickness 38 μm) with a die coater, dried at 80° C. for 30 min, and heat cured at 130 for 60 min to give a resin composition sheet having a resin composition layer with a thickness of 40 μm.

Example 2

A maleic anhydride modified styrene-isobutylene-styrene block copolymer (T-YP757B, 40% Swasol solution, 80 parts) was mixed with a dicyclopentadiene modified hydrocarbon resin (quintone1345, 60% toluene solution, 14 parts) and a cyclohexyl ring-containing saturated hydrocarbon resin (ARKON P-125, 60% toluene solution, 40 parts), and the mixture was mixed in a high-speed rotation mixer to give a uniform mixed solution. The mixed solution was uniformly mixed with an epoxy resin (HP-7200H, 20 parts) and an anion polymerization curing agent (TAP, 1 part) in a high-speed rotation mixer to give varnish. Using the obtained varnish and in the same manner as in Example 1, a resin composition sheet was obtained.

Comparative Example 1

A styrene-isobutylene-styrene block copolymer (SIB-STAR-102T, 50% Swasol solution, 100 parts) was mixed with a dicyclopentadiene modified hydrocarbon resin (quintone1345, 60% toluene solution, 14 parts) and a cyclohexyl ring-containing saturated hydrocarbon resin (ARKON P125, 60% toluene solution, 40 parts), and the mixture was mixed in a high-speed rotation mixer to give a uniform solution. Using the obtained varnish and in the same manner as in Example 1, a resin composition sheet was obtained.

Comparative Example 2

A styrene-isobutylene-styrene block copolymer (SIB-STAR-102T, 50% Swasol solution, 89 parts) was mixed with a dicyclopentadiene modified hydrocarbon resin (quintone1345, 60% toluene solution, 14 parts) and a cyclohexyl ring-containing saturated hydrocarbon resin (ARKON P125, 60% toluene solution, 40 parts), and the mixture was mixed in a high-speed rotation mixer to give a uniform mixed solution. The mixed solution was uniformly mixed with an epoxy resin (HP-7200H, 4 parts) and an anion polymerization curing agent (TAP, 1 part) in a high-speed rotation mixer to give varnish. Using the obtained varnish and in the same manner as in Example 1, a resin composition sheet was obtained.

Comparative Example 3

A styrene-isoprene-styrene block copolymer (SIS5200, 50% Swasol solution, 89 parts) was mixed with maleic anhydride modified liquid polyisobutylene (HV-300M, 7 parts), a dicyclopentadiene modified hydrocarbon resin (quintone1345, 60% toluene solution, 14 parts) and a cyclohexyl ring-containing saturated hydrocarbon resin (ARKON P125, 60% toluene solution, 40 parts), and the mixture was mixed in a high-speed rotation mixer to give a uniform mixed solution. The mixed solution was uniformly mixed with an epoxy resin (HP-7200H, 4 parts) and an anion polymerization curing agent (TAP, 1 part) in a high-speed rotation mixer to give varnish. Using the obtained varnish and in the same manner as in Example 1, a resin composition sheet was obtained.

Comparative Example 4

A styrene-isobutylene-styrene block copolymer (SIB-STAR-102T, 50% Swasol solution, 89 parts) was mixed, after mixing maleic anhydride modified liquid polyisobutylene (HV-300M, 7 parts), talc (D-600, 30 parts) and hydrotalcite (30 parts), and kneading with a three-roll mill, with a dicyclopentadiene modified hydrocarbon resin (quintone1345, 60% toluene solution, 14 parts) and a cyclohexyl ring-containing saturated hydrocarbon resin (ARKON P125, 60% toluene solution, 40 parts), and the mixture was mixed in a high-speed rotation mixer to give a uniform mixed solution. The mixed solution was uniformly mixed with an epoxy resin (HP-7200H, 4 parts) and an anion polymerization curing agent (TAP, 1 part) in a high-speed rotation mixer to give varnish. Using the obtained varnish and in the same manner as in Example 1, a resin composition sheet was obtained.

The results are shown in Table 1.

TABLE 1

| | based on nonvolatile component | Ex. 1 | Ex. 2 | Comp. Ex. 1 | Comp. Ex. 2 | Comp. Ex. 3 | Comp. Ex. 4 |
|---|---|---|---|---|---|---|---|
| (A) | T-YP757B | 45 | 80 | | | | |
| | T-YP766 | 55 | | | | | |
| (B) | Quintone1345 | 14 | 14 | 14 | 14 | 14 | 14 |
| | ARKON P125 | 40 | 40 | 40 | 40 | 40 | 40 |
| (C) | HP7200H | | 20 | | 4 | 4 | 4 |
| (D) | TAP | 1 | 1 | | 1 | 1 | 1 |
| | D600 | | | | | | 30 |
| | hydrotalcite | | | | | | 30 |

TABLE 1-continued

| based on nonvolatile component | | Ex. 1 | Ex. 2 | Comp. Ex. 1 | Comp. Ex. 2 | Comp. Ex. 3 | Comp. Ex. 4 |
|---|---|---|---|---|---|---|---|
| | SIBSTAR-102T | | | 100 | 89 | | 89 |
| | SIS5200 | | | | | 89 | |
| | HV-300M | | | | | 7 | 7 |
| | content of component (A) | 64.7 | 51.7 | 0.0 | 0.0 | 0.0 | 0.0 |
| | content of component (B) | 34.9 | 34.9 | 35.1 | 36.6 | 34.9 | 25.2 |
| adhesiveness resistant to heat and humidity | initial adhesion strength (N/25 mm) | 19.4 | 17.7 | 28.8 | 23.8 | 1.9 | 8.5 |
| | adhesion strength (N/25 mm) after environment test | 21.6 (⊙) | 12.3 (○) | — | 2.5 (X) | — | 7.0 (X) |
| resistance to moisture permeability | moisture-vapor transmission (g/m$^2$) | 29.9 (○) | 29.8 (○) | 29.2 (○) | 30.1 (○) | 57.5 (X) | 10.0 (○) |
| transparency | parallel light transmittance (%) at 450 nm | 90 (⊙) | 90 (⊙) | 90 (⊙) | 90 (⊙) | 90 (⊙) | 72 (X) |

From Examples 1 and 2, it is clear that the resin composition sheet obtained from the sealing resin composition of the present invention has good transparency. In addition, the resin composition sheet does not require active heat curing during and after lamination, adheres with sufficiently high adhesion strength by heating at a low temperature for a short time of 80° C., 20 seconds, can maintain high adhesion strength even after being stood under a high temperature high humidity environment after lamination, and shows good resistance to moisture permeability. According to the present invention, therefore, a resin composition and resin composition sheet which become a sealing material capable of forming, without causing degradation of the organic EL element, a highly reliable sealing structure for an organic EL element susceptible to degradation due to moisture and heat can be obtained, and a highly reliable organic EL device can be provided.

In contrast, component (A) was not used in Comparative Examples 1-3, and the adhesiveness resistant to heat and humidity was inferior, and the transparency was also inferior in Comparative Example 4.

INDUSTRIAL APPLICABILITY

Since the resin composition of the present invention contains a styrene-isobutylene modified resin and a tackifier resin, varnish coating is possible, a sealing resin composition sheet having good transparency, resistance to moisture permeability, and adhesiveness resistant to heat and humidity can be provided. Furthermore, it can be applied to uses such as a sealing resin for a flat panel, a moisture-proof protective film for a print circuit board, a moisture-proof film for a lithium ion battery, a laminate film for packing and the like, and electric products such as television, cellular phone, digital camera and the like, vehicles such as motorcycle, automobile, electric train, boat and ship, airplane and the like, which are equipped with them, can also be provided.

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

The invention claimed is:

1. A sealing resin composition, comprising:
   (A) at least one styrene-isobutylene modified resin having an acid anhydride group concentration of 0.05 to 10 mmol/g, and at least one styrene-isobutylene modified resin having an epoxy group concentration of 0.05 to 10 mmol/g; and
   (B) at least one tackifier resin.

2. A sealing resin composition according to claim 1, wherein the content of (A) is 35 to 80 mass % when the non-volatile component in the resin composition is 100 mass %.

3. A sealing resin composition according to claim 1, wherein said (B) at least one tackifier resin is an alicyclic petroleum resin.

4. A sealing resin composition according to claim 1, wherein said (B) at least one tackifier resin is an alicyclic saturated hydrocarbon resin and/or an alicyclic unsaturated hydrocarbon resin.

5. A sealing resin composition according to claim 1, wherein said (B) at least one tackifier resin is a cyclohexane ring-containing saturated hydrocarbon resin and/or a dicyclopentadiene-modified hydrocarbon resin.

6. A sealing resin composition according to claim 1, wherein the content of said (B) at least one tackifier resin is 5 to 60 mass % when the non-volatile component in the resin composition is 100 mass %.

7. A sealing resin composition according to claim 1, further comprising (C) at least one epoxy resin.

8. A sealing resin composition according to claim 1, further comprising (D) at least one curing agent.

9. A sealing resin composition according to claim 1, wherein a cured product of said resin composition, having a thickness of 40 μm, has a parallel light transmittance at 450 nm of 80 to 100%.

10. A sealing resin composition according to claim 1, wherein a cured product of said resin composition, having a thickness of 40 μm, has a moisture-vapor transmission of 1 to 40 g/m$^2$ in a period of 24 hours, and an adhesion strength after environment test of 10 to 50 N/25 mm.

11. A sealing resin composition sheet, comprising a sealing resin composition according to claim 1.

12. A sealing resin composition sheet according to claim 11, wherein said sealing resin composition is formed on a support.

13. A sealing resin composition sheet according to claim 11, which is adapted for sealing an organic electroluminescence (EL) element.

14. A method of sealing an organic EL element, comprising coating said organic EL element with a sealing resin composition according to claim 1.

15. A method of sealing an organic EL element, comprising laminating said organic EL element with a sealing resin composition sheet according to claim 12.

16. An organic EL device, comprising a sealing resin composition according to claim 1.

17. An organic EL device, which is prepared by a method according to claim 15.

18. A sealing resin composition according to claim 1, wherein the at least one styrene-isobutylene modified resin has an acid anhydride group concentration of 0.2 to 5 mmol/g, and the at least one styrene-isobutylene modified resin has an epoxy group concentration of 0.2 to 5 mmol/g.

* * * * *

UNITED STATES PATENT AND TRADEMARK OFFICE
CERTIFICATE OF CORRECTION

PATENT NO. : 9,676,978 B2
APPLICATION NO. : 14/331421
DATED : June 13, 2017
INVENTOR(S) : Yuichi Kageyama It is certified that error appears in the above-identified patent and that said Letters Patent is hereby corrected as shown below:

On the Title Page

Item (73), the Assignee's information is incorrect. Item (73) should read:
--(73) Assignee: AJINOMOTO CO., INC., Tokyo (JP)--

Signed and Sealed this
Third Day of April, 2018

Andrei Iancu
*Director of the United States Patent and Trademark Office*